United States Patent
Morishige (10) Patent No.: US 6,968,159 B2
(45) Date of Patent: Nov. 22, 2005

(54) FREQUENCY CONVERTER AND COMMUNICATION DEVICE

(75) Inventor: Hideki Morishige, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 411 days.

(21) Appl. No.: 10/239,858

(22) PCT Filed: Feb. 26, 2001

(86) PCT No.: PCT/JP01/01397
§ 371 (c)(1),
(2), (4) Date: Oct. 2, 2002

(87) PCT Pub. No.: WO02/069512
PCT Pub. Date: Sep. 6, 2002

(65) Prior Publication Data
US 2003/0114130 A1 Jun. 19, 2003

(51) Int. Cl.[7] .................................................. H04B 1/40
(52) U.S. Cl. .......................... 455/76; 455/118; 455/318
(58) Field of Search .............................. 455/73, 76, 84, 455/85, 86, 118, 313, 315, 318, 323; 375/219, 295, 316

(56) References Cited

U.S. PATENT DOCUMENTS

| | | | |
|---|---|---|---|
| 5,319,799 A | * | 6/1994 | Morita ........................ 455/78 |
| 5,862,181 A | * | 1/1999 | Ishizuka ..................... 375/259 |
| 6,201,952 B1 | * | 3/2001 | Shimizu et al. .......... 455/180.1 |
| 6,408,195 B1 | | 6/2002 | Hishiki et al. |
| 6,438,358 B1 | * | 8/2002 | Higuchi ....................... 455/84 |
| 6,441,692 B1 | | 8/2002 | Nakatani et al. |

FOREIGN PATENT DOCUMENTS

| | | |
|---|---|---|
| CN | 1222792 | 7/1999 |
| CN | 1228893 | 9/1999 |
| JP | 7-131251 | 5/1995 |
| JP | 11-041132 | 2/1999 |
| JP | 11-98050 | 4/1999 |

* cited by examiner

Primary Examiner—Nguyen T. Vo
(74) Attorney, Agent, or Firm—Oblon, Spivak, McClelland, Maier & Neustadt, P.C.

(57) ABSTRACT

The frequency conversion circuit 30 as an element of a radio communication device, the frequency conversion circuit for converting by using a local oscillator 32 the frequency of a signal which is modulated with a reference oscillation signal from a reference oscillator 31. The frequency conversion circuit 30 is provided with a first mixer 36, a change-over switch 35, and a second mixer 33. The first mixer 36 mixes the reference oscillation signal from the reference oscillator 31 and a local oscillation signal from the local oscillator. The change-over switch 35 selects one of a mixed signal from the first mixer 36 and the local oscillation signal from the local oscillator 32. The second mixer 33 mixes the signal modulated with the reference oscillation signal with an output from the change-over switch 35. The frequency conversion circuit 30, thus configured, may widen a frequency range, without an additional local oscillator, guaranteeing signal purity and response time for shifting the oscillation frequency.

14 Claims, 11 Drawing Sheets

FREQUENCY CONVERTER AND COMMUNICATION DEVICE

TECHNICAL FIELD

This invention relates to a frequency conversion circuit used in such as a radio communication system. The frequency conversion circuit carries out frequency conversion by using a reference oscillator and a local oscillator. This invention also relates to a communication device employing this frequency conversion circuit.

BACKGROUND ART

Figure 10:
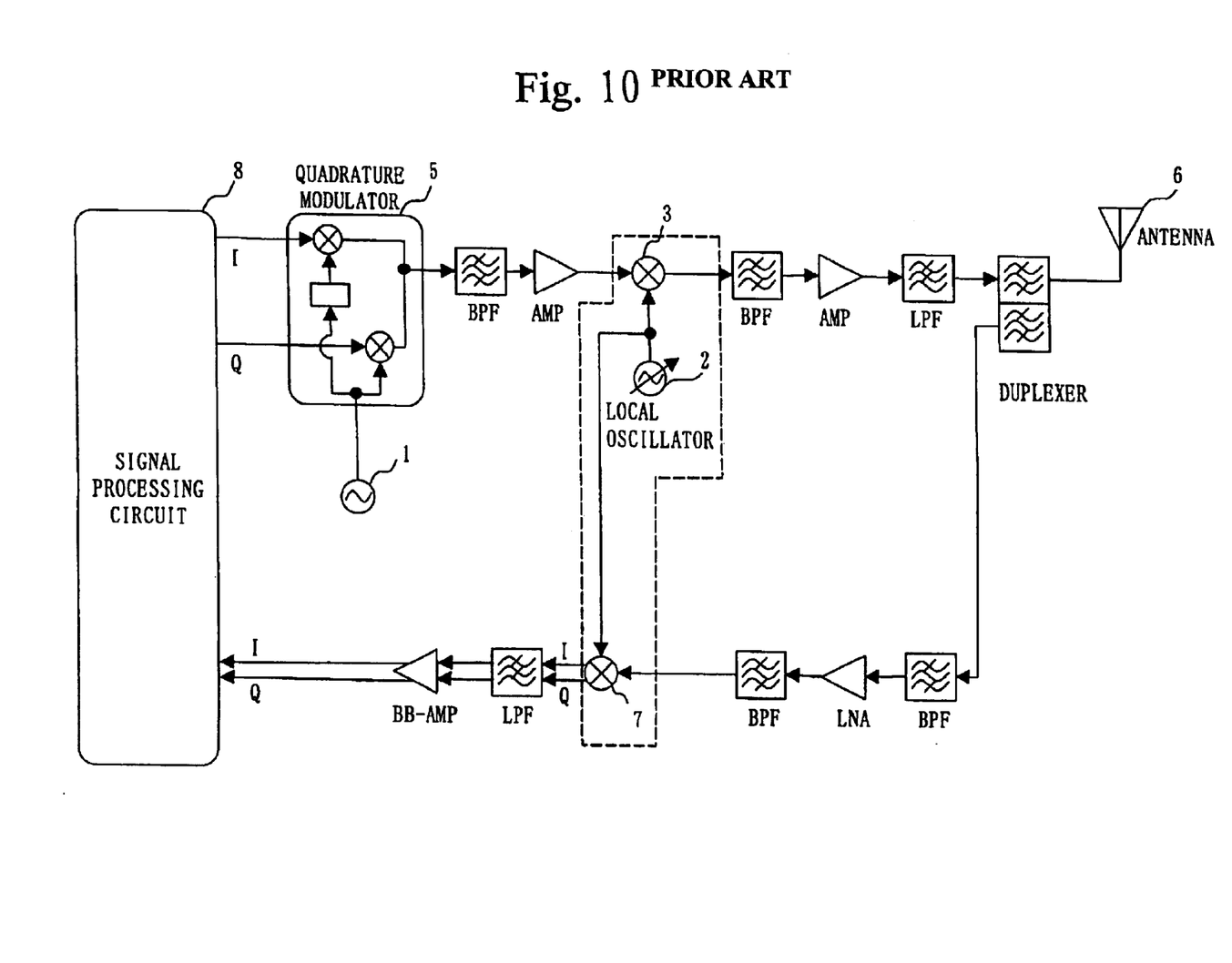
FIG. 10 is a block diagram illustrating the electrical configuration of a radio communication device as a first conventional example.

FIG. 10 is a block diagram illustrating the electrical configuration of a radio communication device as a first conventional example. This radio communication device is provided with a reference oscillator 1 for outputting the reference oscillation signal at a specific frequency, a local oscillator 2 whose oscillation frequency is variable, a mixer 3 for transmission, a quadrature modulator 5 for producing quadrature modulation on the I channel and the Q channel of a baseband signal, an antenna 6 for radio transmission and reception, a mixer 7 for reception, a signal processing circuit 8 for performing various types of signal processing on baseband (BB) transmission and reception signals, and so forth. Then, the local oscillator 2, the mixer 3 and the mixer 7 form a frequency conversion circuit.

In the case of this radio communication device transmitting a signal, initially, a baseband signal (the I channel and the Q channel) for transmission is generated in the signal processing circuit 8. Then, the generated baseband signal is subjected to quadrature modulation by means of a reference oscillation signal which is outputted from the reference oscillator 1. The signal subjected to quadrature modulation is inputted to the mixer 3 by way of a bandpass filter (BPF) and an amplifier (AMP), and then up-converted by means of a local oscillation signal which is outputted from the local oscillator 2 to become a high frequency signal to be adaptable for radio transmission. The up-converted signal then passes through another bandpass filter, another amplifier, a low-pass filter (LPF) and a duplexer to reach the antenna 6 to be outputted through radio transmission.

Then, upon reception of a signal, a signal arrived at the antenna 6 passes through the duplexer, a bandpass filter, a low noise amplifier (LNA) and another bandpass filter then to be inputted to the mixer 7. The mixer 7, also receiving a local oscillation signal from the local oscillator 2, down-converts the received signal into a baseband signal (the I channel, the Q channel). The down-converted signal passes through a low-pass filter and a baseband amplifier (BB-AMP) then to be inputted to the signal processing circuit 8.

Thus, the radio communication device of FIG. 10 generates a radio transmission signal by using the reference oscillator 1 and the frequency modulation circuit (including the local oscillator 2), and also generates a baseband reception signal from a radio signal by using the frequency modulation circuit including the local oscillator 2.

According to a first conventional example, a frequency range may be widened only by widening the frequency variable range of the local oscillator. However, because there is a trade-off between the frequency variable range of the local oscillator and the C/N deterioration and the like of an output signal, widening the frequency variable range results in deteriorating the signal purity. In addition to that, in the case of widening the frequency variable range in a single local oscillator, the response time for shifting an oscillation frequency is caused to become long. In particular, in the case of shifting from a minimum frequency to a maximum frequency, or in the case of shifting from a maximum frequency to a minimum frequency, the response time becomes long. For that reason, in order to guarantee an acceptable degree of signal purity and the response time for shifting the oscillation frequency, the frequency variable range has to be limited.

Figure 11:
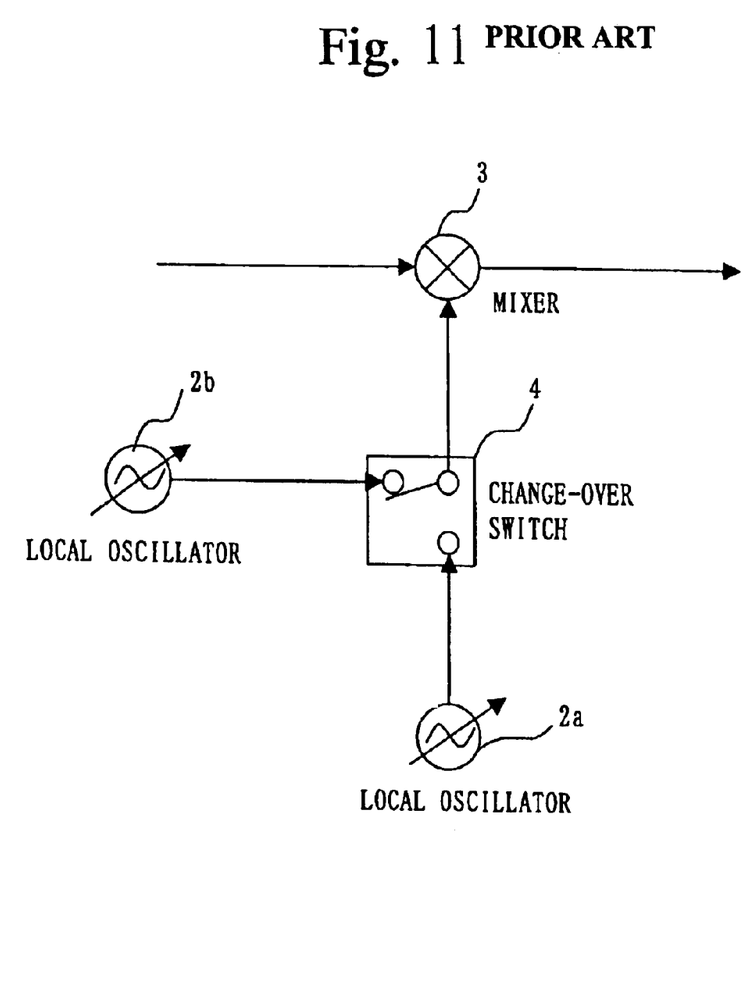
FIG. 11 is a block diagram of a frequency conversion circuit as an element of a second conventional example.

FIG. 11 is a block diagram illustrating a frequency conversion circuit as an element of a second conventional example. A radio communication device according to the second conventional example is configured almost in the same manner as that of FIG. 10 with an only difference in the configuration of the frequency conversion circuit. Specifically, the frequency conversion circuit is provided with local oscillators 2a, 2b whose oscillation frequencies are variable, the mixer 3 for transmission and a change-over switch 4. The change-over switch 4 selects one of outputs from the local oscillators 2a, 2b and then outputs it to the mixer 3. According to the second conventional example, a radio transmission signal is generated by using the reference oscillator 1 and the frequency conversion circuit (including the local oscillators 2a, 2b).

The second conventional example thus uses two local oscillators, thereby guaranteeing the response time for shifting the oscillation frequency for the respective local oscillators. However, the need of having the additional local oscillator has posed a problem of increasing the number of components as well as the scale of the circuit.

DISCLOSURE OF THE INVENTION

An object of this invention is to provide a frequency conversion circuit and a communication device which may widen the frequency variable range, without an additional local oscillator, when guaranteeing the signal purity and the response time for shifting the oscillation frequency.

This invention is directed to a frequency conversion circuit which converts the frequency of a signal, which is modulated with a reference oscillation signal from a reference oscillator, by means of a local oscillator.

The frequency conversion circuit is characterized with a first mixer for mixing the reference oscillation signal from the reference oscillator and a local oscillation signal from the local oscillator; a switch for selecting one of a mixed signal from the first mixer and the local oscillation signal from the local oscillator; and a second mixer for mixing the signal which is modulated with the reference oscillation signal with a signal selected by the switch.

According to this invention, the reference oscillator which is used for signal modulation is diverted for frequency conversion. For that reason, another additional local oscillator other than the local oscillator is not required. Furthermore, the frequency conversion is performed by selecting one of a mixed signal from the reference oscillator and the local oscillator and a single signal of the local oscillation signal from the local oscillator by the switch. For that reason, the band may be widened without widening the frequency variable range of the local oscillator nor deteriorating the signal purity. Still more, frequencies are changed by the switch. This may prevent the response time for shifting frequencies from increasing.

Further, the present invention is characterized with a bandpass filter, which is provided after the first mixer, for eliminating spurious which occurs in the first mixer.

According to this invention, it is allowed to eliminate spurious which may occur when mixing a reference oscillation signal and a local oscillation signal in the first mixer. For that reason, the signal purity may be prevented from being degraded.

Still further, the present invention is characterized with a frequency divider, which is placed between the reference oscillator and the first mixer, for dividing a frequency of the reference oscillation signal.

According to this invention, it is allowed by having the frequency divider for dividing the frequency of a reference oscillation signal that the frequency conversion circuit is capable of handling signals in other frequency variable ranges.

Still further, the present invention is characterized that the frequency divider is a variable frequency divider whose frequency division ratio is variable.

According to this invention, it is allowed by varying the frequency division ratio of the frequency divider to vary the frequency variable range.

Still further, the present invention is characterized further with a bandpass filter, which is provided after the frequency divider, for eliminating spurious which occurs in the frequency divider.

According to this invention, it is allowed to eliminate spurious which may occur when dividing the frequency of a reference oscillation signal in the frequency divider. For that reason, the signal purity may be prevented from being degraded.

Still further, the present invention is characterized further with a multiplier, which is provided between the reference oscillator and the first mixer, for multiplying a frequency of the reference oscillation signal.

According to this invention, it is allowed by having the multiplier for multiplying the frequency of the reference oscillation signal that the frequency conversion circuit is capable of handling signals in other frequency variable ranges.

Still further, the present invention is characterized further with a bandpass filter, which is provided after the multiplier, for eliminating spurious which occurs in the multiplier.

According to this invention, it is allowed to eliminate spurious which may occur when multiplying the frequency of a reference oscillation signal in the multiplier. For that reason, the signal purity may be prevented from being degraded.

Furthermore, the present invention is directed to a communication device, which includes a frequency conversion circuit for up-converting a signal which is modulated with a reference oscillation signal from a reference oscillator by using a local oscillator, the communication device for transmitting a frequency converted signal by the frequency conversion circuit to outside.

The communication device is characterized with the frequency conversion circuit which includes a first mixer for mixing the reference oscillation signal from the reference oscillator and a local oscillation signal from the local oscillator; a switch for selecting one of a mixed signal from the first mixer and the local oscillation signal from the local oscillator; and a second mixer for mixing the signal which is modulated with the reference oscillation signal with a signal selected by the switch.

According to this invention, another additional local oscillator is not required similar to that of the frequency conversion circuit above. Furthermore, the variable frequency range may be widened, guaranteeing the signal purity and the response time for shifting oscillation frequencies.

Still further, the present invention is characterized that the frequency conversion circuit further includes a third mixer for mixing a signal received from outside with an output from the switch and for down-converting.

According to this invention, the frequency conversion circuit which is used for converting the frequency of a transmission signal is shared on the reception side, which allows the reception side to eliminate the necessity of having a special reference oscillator and a special local oscillator for the reception side, which simplifies the configuration of the communication device.

BEST MODE FOR CARRYING OUT THE INVENTION

The embodiments of the present invention will be discussed below with reference to the drawings.

(First Embodiment)

Figure 1:
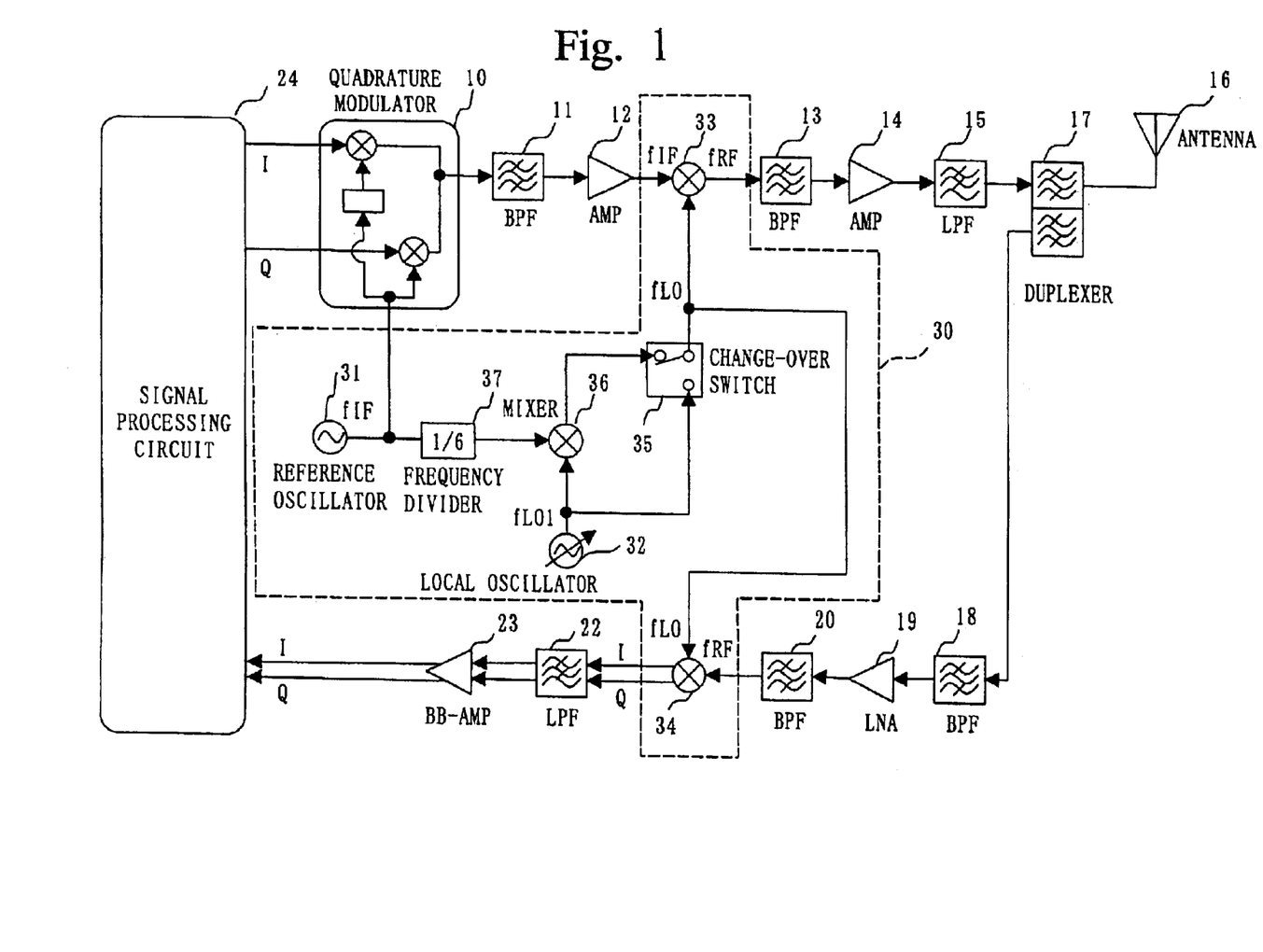
FIG. 1 is a block diagram illustrating the electrical configuration of a radio communication device as a first embodiment.

FIG. 1 is a block diagram illustrating an electrical configuration of a radio communication device as a first embodiment. This radio communication device is provided with a quadrature modulator 10, bandpass filters (BPF) 11, 13, 18, 20, amplifiers 12, 14, low-pass filters (LPF) 15, 22, an antenna 16, a duplexer 17, a low noise amplifier (LNA) 19, a baseband amplifier (BB-AMP) 23, a signal processing circuit 24, and a frequency conversion circuit 30. The quadrature modulator 10 is a modulator which mixes a baseband signal (the I channel, the Q channel) sent from the signal processing circuit 24 with the reference oscillation signal of a reference oscillator 31 and carried out the quadrature modulation. The bandpass filter 11 eliminates an unnecessary signal which may occur through the quadrature modulation carried out by the quadrature modulator 10. The amplifier 12 amplifies a signal passed through the bandpass filter 11. The bandpass filter 13 eliminates an unnecessary signal which may occur when a signal amplified in the amplifier 12 and a selected local oscillation signal by a change-over switch 35 (explained later) are mixed in the mixer 33 to be converted into a high frequency signal. The amplifier 14 amplifies a signal passed through the bandpass filter 13. The low-pass filter 15 eliminates a harmonic distortion which may occur through the amplification of a signal in the amplifier 14.

The duplexer 17 is a filter provided for allowing the single antenna 16 to be shared for transmission and reception, and used for preventing a signal passing through one channel from entering the other channel for transmission or reception. The duplexer 17 is formed by combining the transmission filter (BPF) which lets the signals of the transmission band only pass through and the reception filter (BPF) which lets the signals of the reception band only pass through.

The bandpass filter 18 eliminates signals other than those of the reception band from signals received through the antenna 16. The low noise amplifier 19 amplifies a signal passed through the bandpass filter 18. The bandpass filter 20 eliminates an unnecessary signal (including a harmonic distortion) which may occur through the amplification of the signal in the low noise amplifier 19. The low pass filter 22 eliminates an unnecessary harmonic distortion which may occur in the mixer 34. The base band amplifier 23 amplifies a baseband signal passed through the low-pass filter 22.

The signal processing circuit 24 is a circuit provided for carrying out various types of signal processing on transmitting and received baseband signals.

When this radio communication device transmits a signal, firstly, a baseband signal (the I channel, the Q channel) for transmission is generated in the signal processing circuit 24. Then, the generated baseband signal is subjected to quadrature modulation by using a reference oscillation signal which is outputted from the reference oscillator 31. The signal subjected to quadrature modulation is then inputted to the mixer 33 through the bandpass filter 11 and the amplifier 12 according to this order. A signal from the amplifier 12 is mixed in the mixer 33 with a local oscillation signal from the local oscillator 32, and then up-converted into a high frequency signal to be adaptable for radio transmission. Then, the up-converted signal passes through the bandpass filter 13, the amplifier 14, the low-pass filter 15 and the duplexer 17 according to this order then to be transmitted through the antenna 16.

Upon reception of a signal, on the other hand, a signal received through the antenna 16 passes through the duplexer 17, the bandpass filter 18, the low noise amplifier 19, and the bandpass filter 20 according to this order then to be inputted to the mixer 34. The signal from the bandpass filter 20 is mixed in the mixer 34 with a local oscillation signal from the local oscillator 32 to be down-converted into a baseband signal (the I channel, the Q channel). The down-converted signal passes through the low-pass filter 22 and the baseband amplifier 23 according to this order, then to be sent to the signal processing circuit 24.

The frequency conversion circuit 30 is explained below. The frequency conversion circuit 30 is a circuit provided for up-converting a signal modulated in the quadrature modulator 10 into a radio transmission frequency signal and down-converting a received radio signal into a baseband signal. The frequency conversion circuit 30 is provided with the reference oscillator 31, the local oscillator 32, the mixers 33, 34, 36, the change-over switch 35, and a frequency divider 37.

The reference oscillator 31 is a local oscillator using the frequency of an output signal at a given fixed frequency. For example, the reference oscillator 31 outputs a signal at the frequency of $f_{IF}$=360 MHz. The local oscillator 32 is a local oscillator whose oscillation frequency can be variable, which outputs a signal at $f_{LO1}$=1750~1810 MHz, for example. Those local oscillators are PLL (Phase Locked Loop) circuits. The mixer 33 (a second mixer) mixes a signal from the amplifier 12 with a signal from the change-over switch 35. The mixer 34 (a third mixer) mixes a reception signal passed through the bandpass filer 20 with a signal selected by the change-over switch 35. The change-over switch 35 selects one of signals from the local oscillator 32 and the mixer 36, and then inputs a selected signal to the mixer 33 and the mixer 34. The mixer 36 (a first mixer) mixes a signal outputted from the reference oscillator 31 via the frequency divider 37 with a signal from the local oscillator 32. The frequency divider 37, which is placed between the reference oscillator 31 and the mixer 36, divides the oscillation frequency of the reference oscillator 31 according to a fixed frequency division ratio 1/6, and then outputs the signal at a divided frequency.

According to this frequency conversion circuit 30, the frequency, $f_{LO1}$=1750~1810 MHz, of an oscillation signal which is outputted directly from the local oscillator 32 is a first local oscillation signal frequency. Then, the reference frequency $f_{IF}$=360 MHz by the reference oscillator 31 is divided by the frequency divider 37 to become 1/6 of the reference frequency, i.e., 60 MHz, which is now mixed with the oscillation frequency, $f_{LO1}$=1750~1810 MHz, of the local oscillator 32 to become a mixed frequency, 1810~1870 MHz. This mixed frequency of 1810~1870 MHz is the second local oscillator signal frequency. Of the first local oscillation signal frequency and the second local oscillation signal frequency, either one is selected by the change-over switch 35. As a result, even if the frequency variable range of the local oscillator 32 is 1750~1810 MHz, the frequency conversion circuit 30, as a whole, is still capable of handling signals in the wider range of frequencies of 1750~1870 MHz.

Thus, according to the first embodiment, the reference oscillator 31 which is used for signal modulation is now diverted for frequency conversion. For that reason, another additional local oscillator other than the local oscillator 32 is not required. Furthermore, the frequency conversion is performed by selecting one of a mixed signal from the reference oscillator 31 and the local oscillator 32 and a single signal of the local oscillation signal from the local oscillator 32 by the change-over switch 35. For that reason, the band may be widened without widening the frequency variable range of the local oscillator 32 nor deteriorating the signal purity. Still more, frequencies are changed by the change-over switch 35. This may serve for quick frequency shifting. On top of it, if the frequency setting of the local oscillator 32 and the switching operation of the change-over switch 35 are carried out at the same time, quicker frequency shifting can be obtained.

It is to be noted that although this embodiment employs the LPF 15 and the BPF 18, if a sufficient performance is achieved by the duplexer 17, and in other words, if the duplexer 17 sufficiently eliminates signals other than those in the frequency range for transmission from transmission signals as well as signals other than those in the frequency range for reception from reception signals, then the LPF 15 and the BPF 18 may be omitted.

Upon discussion of a second embodiment through a ninth embodiment given below, it is to be noted that each of those embodiments employs the same radio communication device as that of the first embodiment except for the frequency conversion circuit. For this reason, only the frequency conversion circuits will be explained in those embodiments, and the other parts of which will not be explained. Furthermore, the mixer 34 for mixing a signal from the change-over switch 35 with a reception signal is provided in the respective embodiments of the second embodiment through the ninth embodiment, but the mixer 34 is not shown in any of FIG. 2 through FIG. 9.

(Second Embodiment)

Figure 2:
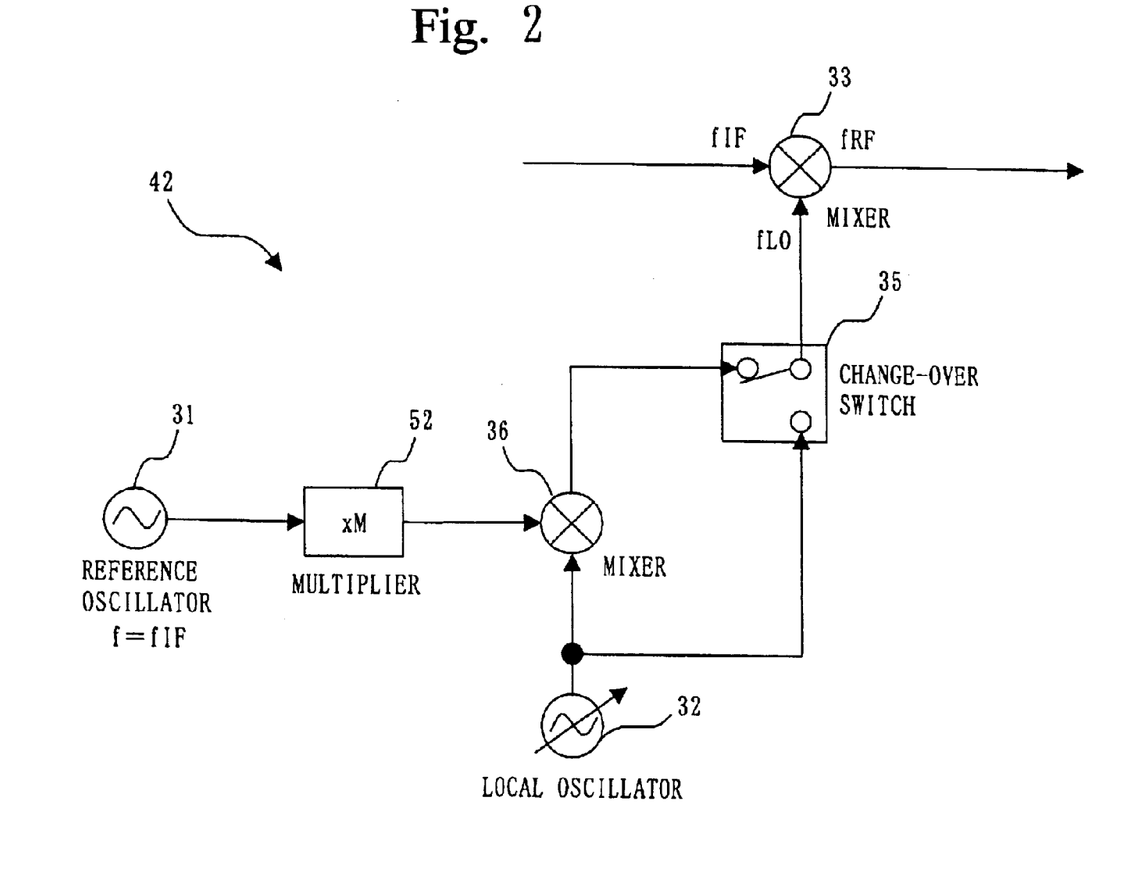
FIG. 2 is a block diagram of a frequency conversion circuit as an element of a second embodiment.

FIG. 2 is a block diagram of a frequency conversion circuit as an element of a second embodiment. A frequency conversion circuit 42 modifies the frequency conversion circuit 30 (FIG. 1) by replacing the frequency divider 37 by a multiplier 52. The multiplier 52 is placed between the reference oscillator 31 and the mixer 36, and multiplies the oscillation frequency of the reference oscillator 31 by a fixed multiplication ratio M. As a result, the frequency conversion circuit 42 is adaptable to handling frequencies in a variable range different from the frequency variable range of 1750~1870 MHz which is applied to the frequency conversion circuit 30 (FIG. 1).

The configuration of the frequency conversion circuit 42 is the same as that of the frequency conversion circuit 30 (FIG. 1) except for the multiplier 52. For that reason, the second embodiment also allows the variable frequency range to be widened, without an additional local oscillator, guaranteeing the signal purity and the response time for shifting the oscillation frequency, as discussed in the first embodiment.

(Third Embodiment)

Figure 3:
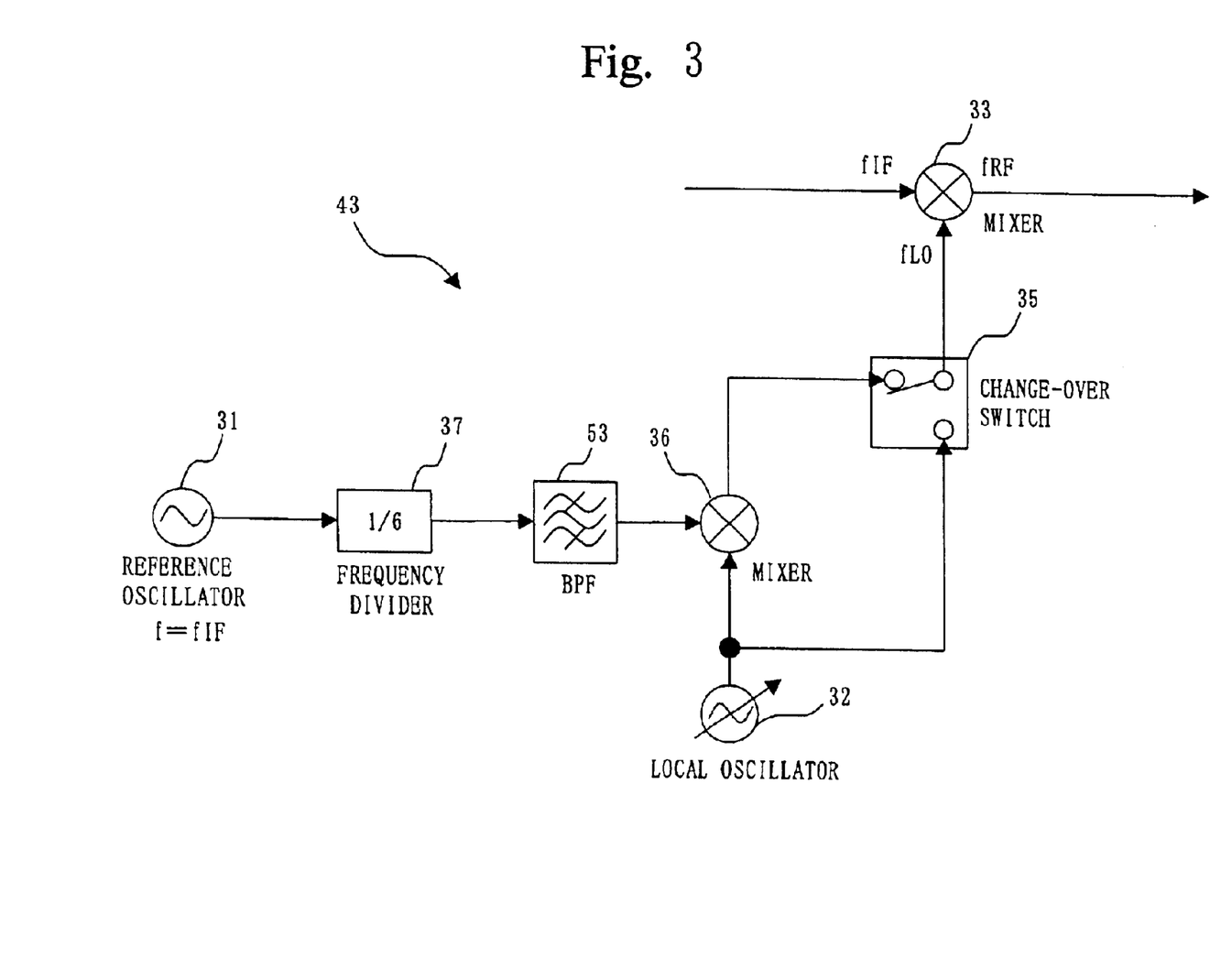
FIG. 3 is a block diagram of a frequency conversion circuit as an element of a third embodiment.

FIG. 3 is a block diagram of a frequency conversion circuit as an element in a third embodiment. A frequency conversion circuit 43 modifies the frequency conversion circuit 30 (FIG. 1) by adding a bandpass filter 53 between the frequency divider 37 and the mixer 36. The bandpass filter 53 is a filter provided for eliminating spurious which may occur when the frequency divider 37 divides the frequency of the reference oscillation signal. Thus, the spurious occurred in the frequency divider 37 is eliminated immediately after it occurred, and therefore unnecessary spurious is not allowed to remain behind after the mixer 36. As a result, the signal purity may be kept in a good condition.

The configuration of the frequency conversion circuit 43 is the same as that of the frequency conversion circuit 30 (FIG. 1) except for the additionally provided bandpass filter 53. For that reason, the third embodiment also allows the variable frequency range to be widened, without an additional local oscillator, guaranteeing the signal purity and the response time for shifting the oscillation frequency, as discussed in the first embodiment.

It is to be noted that the bandpass filter 53 is employed in this embodiment, but a low-pass filter may be used instead in the case of only few occurrences of low frequency signals which are lower than those obtained after frequency division by the frequency divider 37.

(Fourth Embodiment)

Figure 4:
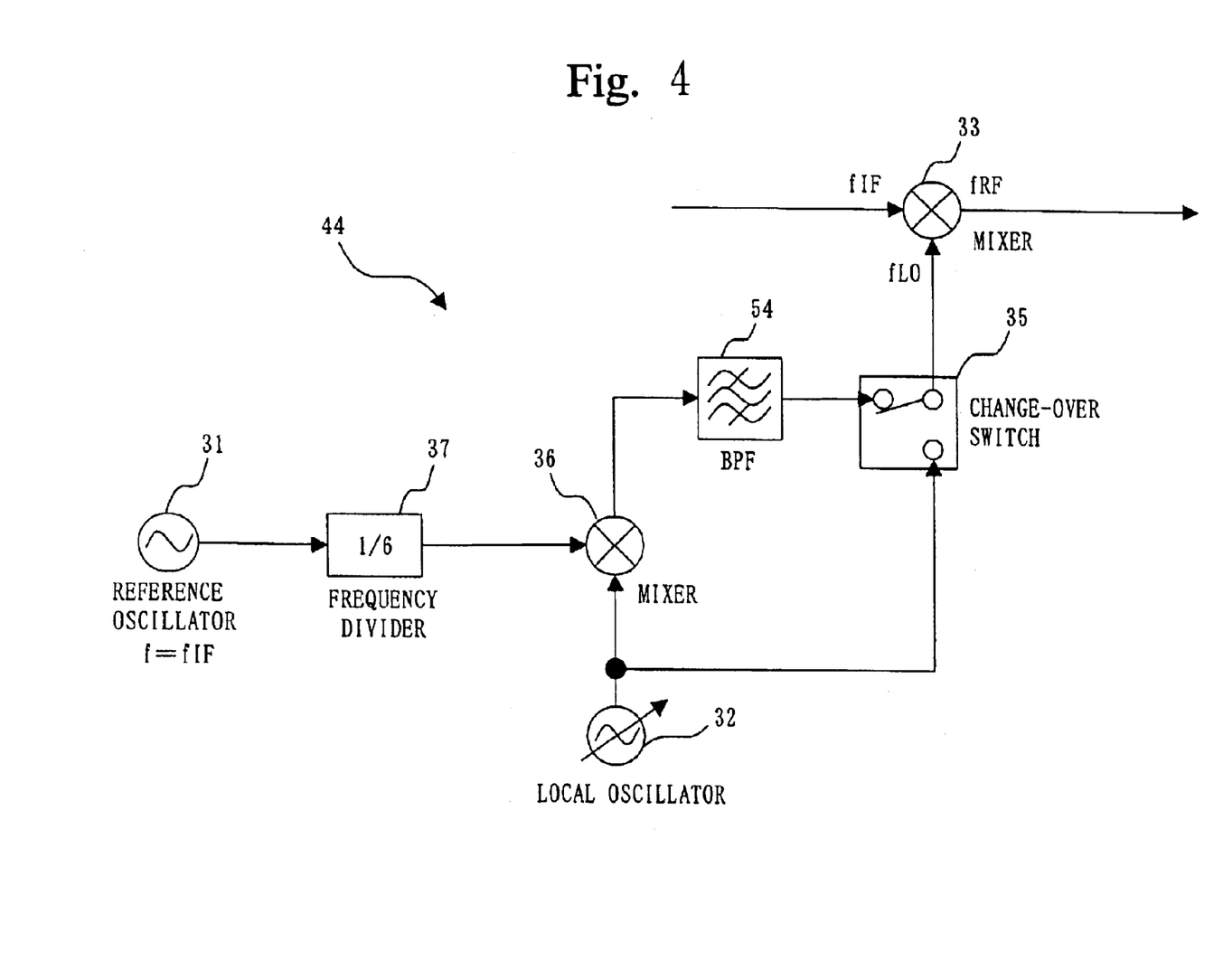
FIG. 4 is a block diagram of a frequency conversion circuit as an element of a fourth embodiment.

FIG. 4 is a block diagram of a frequency conversion circuit as an element of a fourth embodiment. A frequency conversion circuit 44 modifies the frequency conversion circuit 30 (FIG. 1) by adding a bandpass filter 54 between the mixer 36 and the change-over switch 35. The bandpass filter 54 is a filter provided for eliminating spurious which may occur when the mixer 36 mixes a signal from the frequency divider 37 and a signal from the local oscillator 32. Thus, the spurious occurred in the mixer 36 is eliminated immediately after it occurred, and therefore unnecessary spurious is not allowed to remain behind after the change-over switch 35. As a result, the signal purity may be maintained in a good condition.

The configuration of the frequency conversion circuit 44 is the same as that of the frequency conversion circuit 30 (FIG. 1) except for the additionally provided bandpass filter 54. For that reason, the fourth embodiment also allows the variable frequency range to be widened, without an additional local oscillator, guaranteeing the signal purity and the response time for shifting the oscillation frequency, as discussed in the first embodiment.

(Fifth Embodiment)

Figure 5:
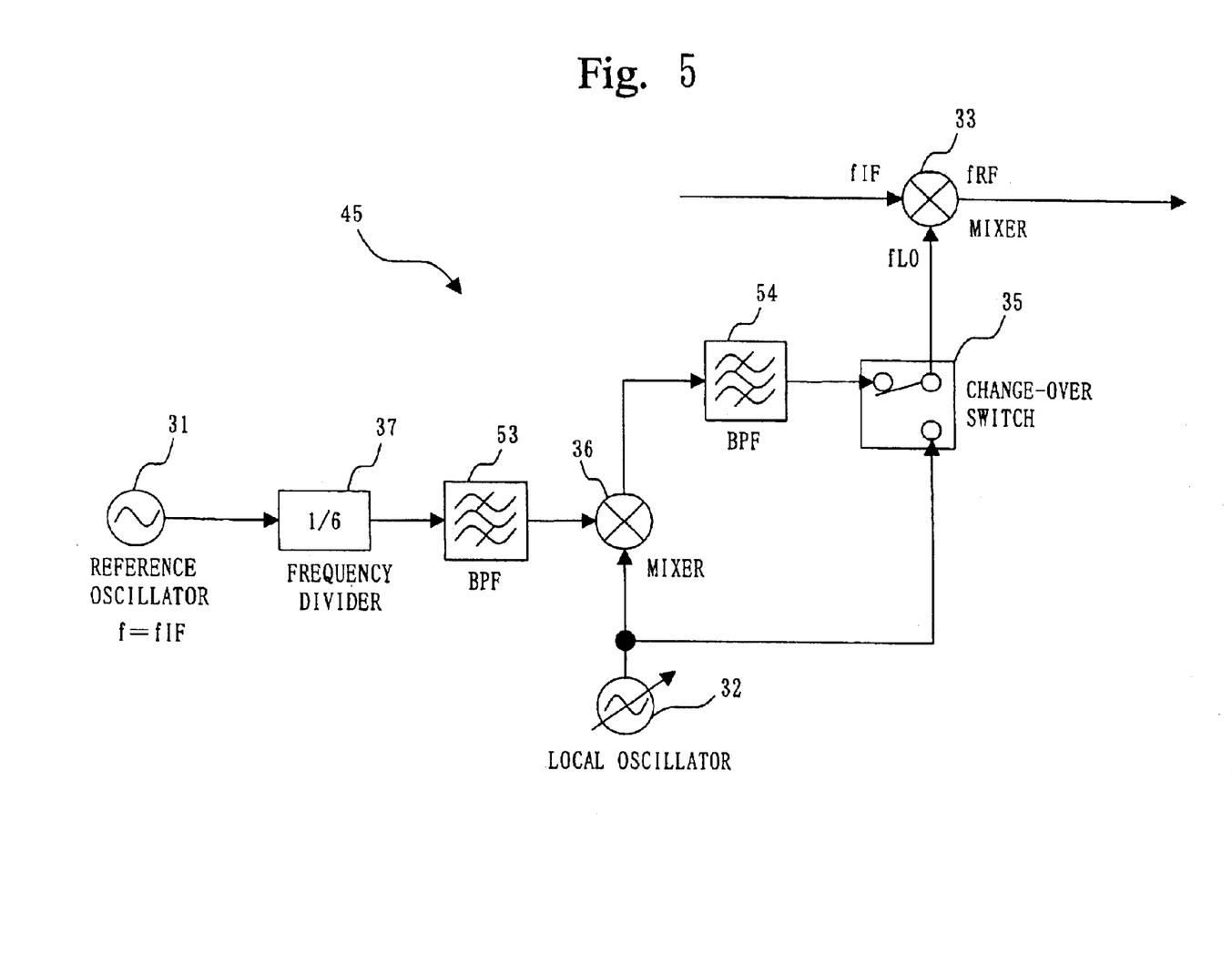
FIG. 5 is a block diagram of a frequency conversion circuit as an element of a fifth embodiment.

FIG. 5 is a block diagram of a frequency conversion circuit as an element of a fifth embodiment. A frequency conversion circuit 45 modifies the frequency conversion circuit 30 (FIG. 1) by adding both of the bandpass filter 53 (FIG. 3) and the bandpass filter 54 (FIG. 4). In other words, the bandpass filter 53 being provided between the frequency divider 37 and the mixer 36 serves for eliminating spurious which may occur in the frequency divider 37. Also, the bandpass filter 54 being provided between the mixer 36 and the change-over switch 35 serves for eliminating spurious which may occur in the mixer 36. Thus, the spurious occurred in the frequency divider 37 is eliminated immediately after it occurred, and therefore unnecessary spurious is not allowed to remain behind after the mixer 36. Similarly, the spurious occurred in the mixer 36 is eliminated immediately after it occurred, and therefore unnecessary spurious is not allowed to remain behind after the change-over switch 35. As a result, the signal purity may be kept in a good condition The configuration of the frequency conversion circuit 45 is the same as that of the frequency conversion circuit 30 (FIG. 1) except for the additionally provided bandpass filters 53 and 54. For that reason, the fifth embodiment also allows the variable frequency range to be widened, without an additional local oscillator, guaranteeing the signal purity and the response time for shifting the oscillation frequency, as discussed in the first embodiment.

(Sixth Embodiment)

Figure 6:
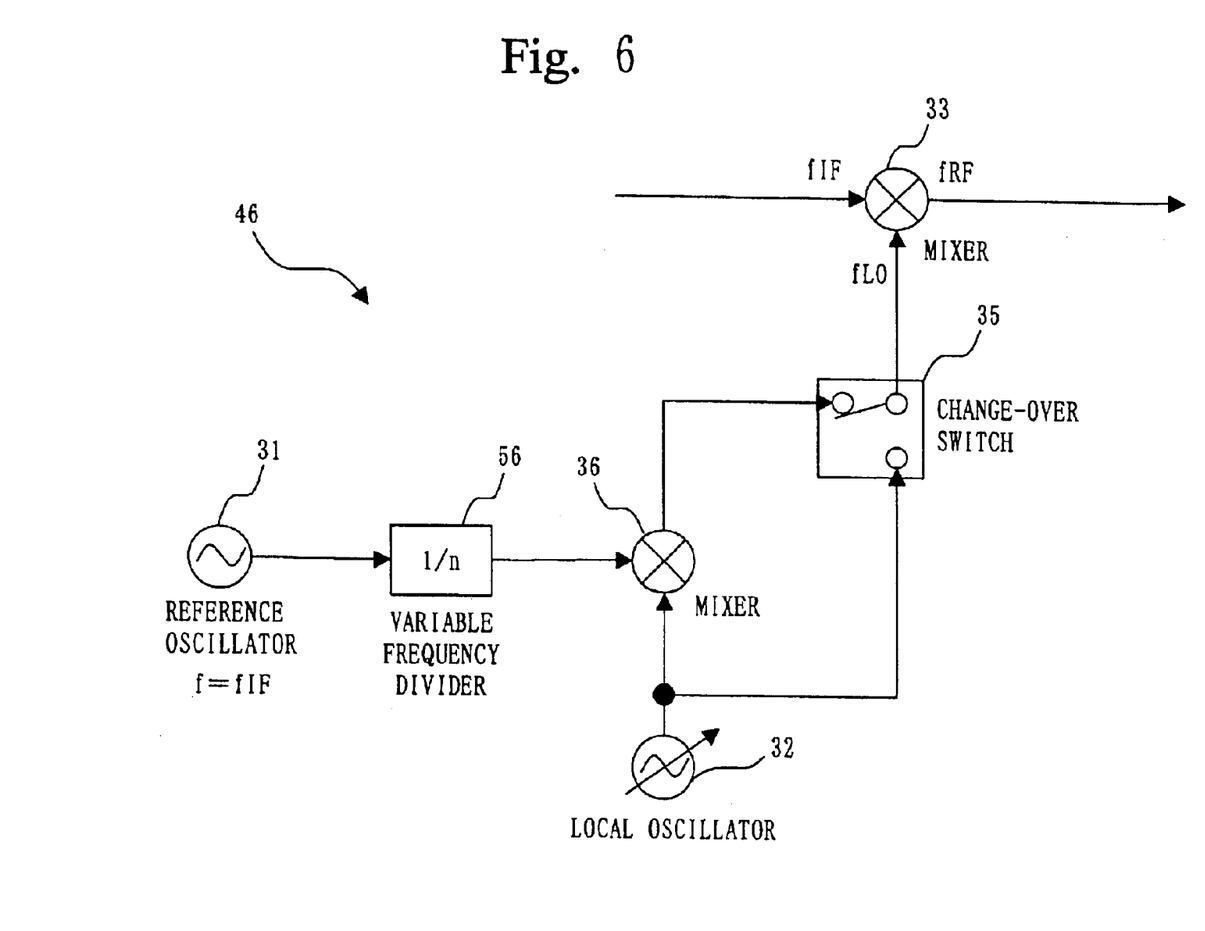
FIG. 6 is a block diagram of a frequency conversion circuit as an element of a sixth embodiment.

FIG. 6 is a block diagram of a frequency conversion circuit as an element of a sixth embodiment. A frequency conversion circuit 46 modifies the frequency conversion circuit 30 (FIG. 1) by replacing the frequency divider 37 by a variable frequency divider 56. The frequency division ratio of the variable frequency divider 56 is variable whereas the frequency division ratio of the frequency divider 37 is fixed (1/6). By varying the frequency division ratio of this variable frequency divider 56, the variable range of frequency is allowed to be further widened.

The configuration of the frequency conversion circuit 46 is the same as that of the frequency conversion circuit 30 (FIG. 1) except for the variable frequency divider 56. For that reason, the sixth embodiment also allows the variable frequency range to be widened, without an additional new local oscillator, guaranteeing the signal purity and the response time for shifting the oscillation frequency, as discussed in the first embodiment.

(Seventh Embodiment)

Figure 7:
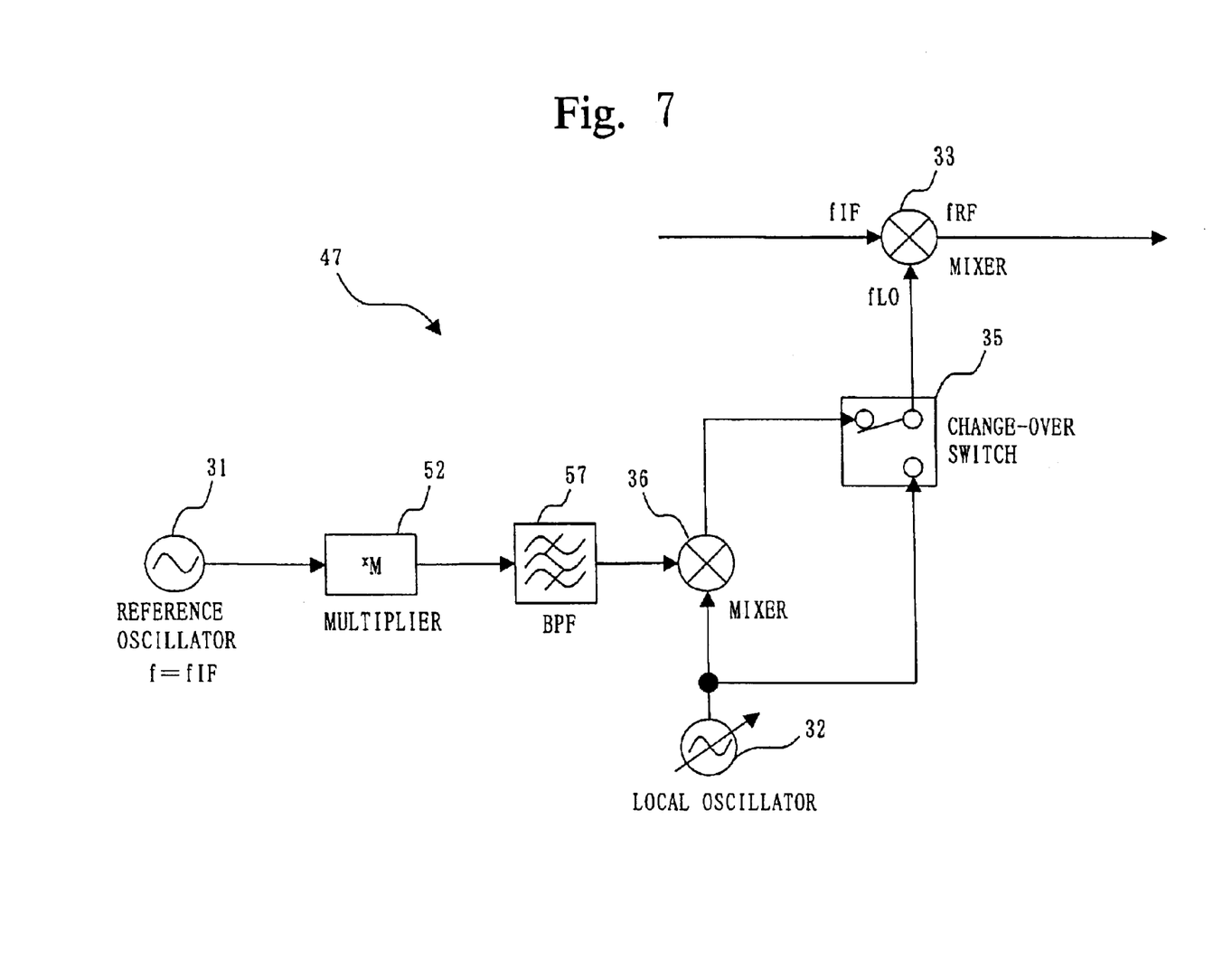
FIG. 7 is a block diagram of a frequency conversion circuit as an element of a seventh embodiment.

FIG. 7 is a block diagram of a frequency conversion circuit as an element of a seventh embodiment. A frequency conversion circuit 47 modifies the frequency conversion circuit 42 (FIG. 2) by adding a bandpass filter 57 between the multiplier 52 and the mixer 36. The bandpass filter 57 is a filter provided for eliminating spurious which may occur when the multiplier 52 multiplies the reference oscillation signal. Thus, the spurious occurred in the multiplier 52 is eliminated immediately after it occurred, and therefore unnecessary spurious is not allowed to remain behind after the mixer 36. As a result, the signal purity may be maintained in a good condition.

The configuration of the frequency conversion circuit 44 is the same as that of the frequency conversion circuit 42

(FIG. 2) except for the additionally provided bandpass filter 57. For that reason, the seventh embodiment also allows to widen the range of variable frequency, without requiring an additional new local oscillator, guaranteeing the signal purity and the response time for shifting the oscillation frequency, as discussed in the second embodiment.

It is to be noted that the bandpass filter 57 is employed in this embodiment, but a low-pass filter may be used instead in the case of only few occurrences of low frequency signals which are lower than those obtained after multiplication by the multiplier 52.

(Eighth Embodiment)

Figure 8:
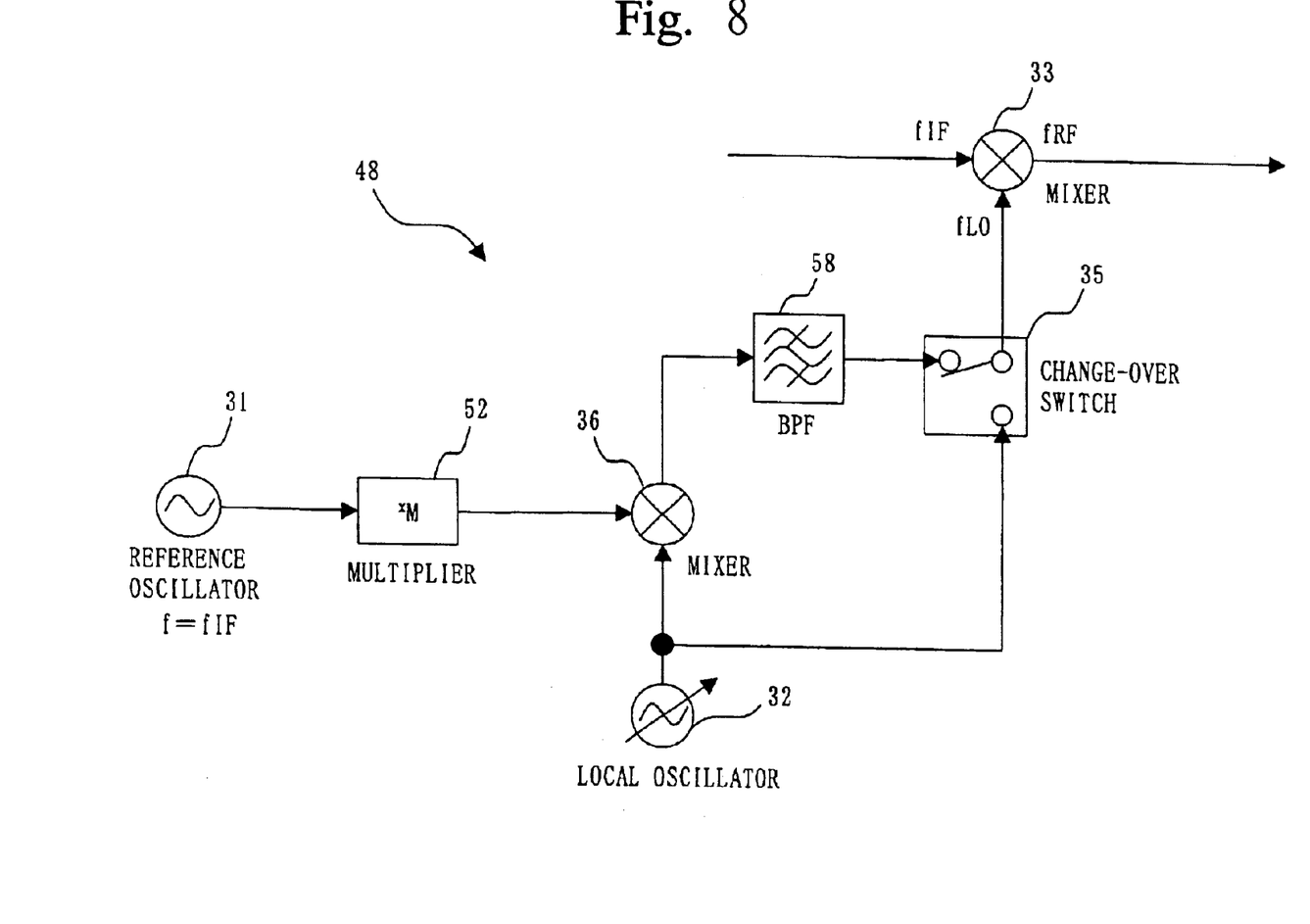
FIG. 8 is a block diagram of a frequency conversion circuit as an element of an eighth embodiment.

FIG. 8 is a block diagram of a frequency conversion circuit as an element of an eighth embodiment. The frequency conversion circuit 48 modifies the frequency conversion circuit 42 (FIG. 2) by adding a bandpass filter 58 between the mixer 36 and the change-over switch 35. The bandpass filter 58 is a filter provided for eliminating spurious which may occur when the mixer 36 mixes a signal from the multiplier 52 and a local oscillation signal from the local oscillator 32. Thus, the spurious occurred in the mixer 36 is eliminated immediately after it occurred, and therefore unnecessary spurious is not allowed to remain behind after the change-over switch 35. As a result, the signal purity may be maintained in a good condition.

The configuration of the frequency conversion circuit 48 is the same as that of the frequency conversion circuit 42 (FIG. 2) except for the additionally provided bandpass filter 58. For that reason, the eighth embodiment also allows the variable frequency range to be widened, without an additional new local oscillator, guaranteeing the signal purity and the response time for shifting the oscillation frequency, as discussed in the second embodiment.

(Ninth Embodiment)

Figure 9:
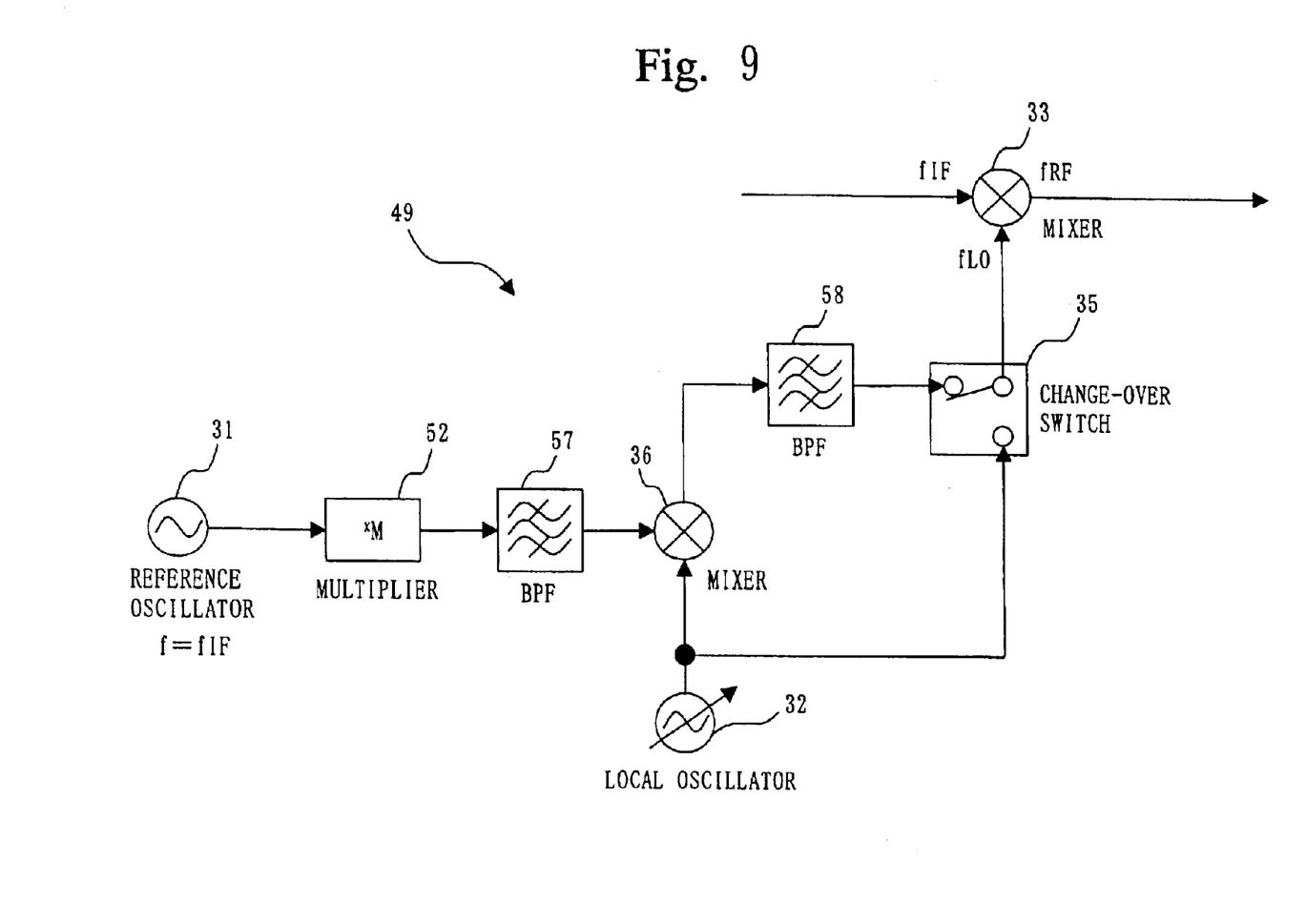
FIG. 9 is a block diagram of a frequency conversion circuit as an element of a ninth embodiment.

FIG. 9 is a block diagram of a frequency conversion circuit as an element of a ninth embodiment. A frequency conversion circuit 49 modifies the frequency conversion circuit 42 (FIG. 2) by adding both of the bandpass filter 57 (FIG. 7) and the bandpass filter 58 (FIG. 8). In other words, the bandpass filter 57 being provided between the multiplier 52 and the mixer 36 serves for eliminating spurious which may occur in the multiplier 52. Similarly, the bandpass filter 58 being provided between the mixer 36 and the change-over switch 35 serves for eliminating spurious which may occur in the mixer 36. Thus, the spurious occurred in the multiplier 52 is eliminated immediately after it occurred, and therefore unnecessary spurious is not allowed to remain behind after the mixer 36. Similarly, the spurious occurred in the mixer 36 is thus eliminated immediately after it occurred, and therefore unnecessary spurious is not allowed to remain behind after the change-over switch 35. As a result, the signal purity may be kept in a good condition The configuration of the frequency conversion circuit 49 is the same as that of the frequency conversion circuit 42 (FIG. 2) except for the additionally provided bandpass filters 57 and 58. For that reason, the ninth embodiment also allows the variable frequency range, without an additional local oscillator, guaranteeing the signal purity and the response time for shifting the oscillation frequency, as discussed in the second embodiment.

INDUSTRIAL APPLICABILITY

The frequency conversion circuit and the communication device according to the present invention discussed above are adaptable to a radio communication system, a base transceiver station, and a radio terminal device of such as the CDMA system.

What is claimed is:

1. A frequency conversion circuit for converting a frequency of a signal by using a local oscillator, the signal being modulated with a reference oscillation signal which is generated by a reference oscillator, the frequency conversion circuit comprising:
   a first mixer for mixing the reference oscillation signal generated by the reference oscillator and a local oscillation signal generated by the local oscillator;
   a switch for selecting one of a mixed signal received from the first mixer and the local oscillation signal received from the local oscillator; and
   a second mixer for mixing the signal which is modulated with the reference oscillation signal with a signal selected by the switch.

2. The frequency conversion circuit according to claim 1, comprising a bandpass filter, which is placed after the first mixer, for eliminating spurious which occurs in the first mixer.

3. The frequency conversion circuit according to claim 2, further comprising a frequency divider, which is placed between the reference oscillator and the first mixer, for dividing a frequency of the reference oscillation signal.

4. The frequency conversion circuit according to claim 3, wherein the frequency divider is a variable frequency divider whose frequency division ratio is variable.

5. The frequency conversion circuit according to claim 3, comprising a bandpass filter, which is placed after the frequency divider, for eliminating spurious which occurs in the frequency divider.

6. The frequency conversion circuit according to claim 2, comprising a multiplier, which is placed between the reference oscillator and the first mixer, for multiplying a frequency of the reference oscillation signal.

7. The frequency conversion circuit according to claim 6, further comprising a bandpass filter, which is placed after the multiplier, for eliminating spurious which occurs in the multiplier.

8. The frequency conversion circuit according to claim 1, further comprising a frequency divider, which is placed between the reference oscillator and the first mixer, for dividing a frequency of the reference oscillation signal.

9. The frequency conversion circuit according to claim 8, wherein the frequency divider is a variable frequency divider whose frequency division ratio is variable.

10. The frequency conversion circuit according to claim 8, comprising a bandpass filter, which is placed after the frequency divider, for eliminating spurious which occurs in the frequency divider.

11. The frequency conversion circuit according to claim 1, comprising a multiplier, which is placed between the reference oscillator and the first mixer, for multiplying a frequency of the reference oscillation signal.

12. The frequency conversion circuit according to claim 11, further comprising a bandpass filter, which is placed after the multiplier, for eliminating spurious which occurs in the multiplier.

13. A communication device, which includes a frequency conversion circuit for up-converting a signal which is modulated with a reference oscillation signal received from a reference oscillator by using a local oscillator, the communication device for transmitting a frequency converted signal by the frequency conversion circuit to outside,
   wherein the frequency conversion circuit includes,
   a first mixer for mixing the reference oscillation signal from the reference oscillator and a local oscillation signal from the local oscillator, a switch for selecting one of a mixed signal received from the first mixer and the local oscillation signal received from the local oscillator, and a second mixer for mixing the signal which is modulated with the reference oscillation signal with a signal selected by the switch.

14. The communication device according to claim 13, wherein the frequency conversion circuit further includes a third mixer for mixing a signal received from outside with an output from the switch and for down-converting.

* * * * *